United States Patent [19]
Murata et al.

[11] Patent Number: 5,590,272
[45] Date of Patent: Dec. 31, 1996

[54] METHOD AND SYSTEM FOR A HIGH-RELIABLE DISK SYSTEM

[75] Inventors: Tomohiro Murata, Yokohama; Kenzo Kurihara, Tokyo; Kazuhiro Kawashima, Yokohama; Mitsuaki Niida, Kanagawa-ken, all of Japan

[73] Assignee: Hitachi, Ltd., Tokyo, Japan

[21] Appl. No.: 993,394

[22] Filed: Dec. 21, 1992

[30] Foreign Application Priority Data

Dec. 26, 1991 [JP] Japan .................................. 3-357579

[51] Int. Cl.⁶ .................................................. G06F 11/00
[52] U.S. Cl. ....................... 395/181; 369/54; 395/182.04
[58] Field of Search .................................. 371/10.1, 10.2, 371/10.3, 11.3; 395/181, 183.03, 182.03, 185.07, 182.06, 182.04, 182.08, 182.09, 184.01, 185.01; 369/54, 47; 360/47, 53

[56] References Cited

U.S. PATENT DOCUMENTS

| | | | |
|---|---|---|---|
| 4,434,487 | 2/1984 | Rubinson et al. | 371/10 |
| 4,984,230 | 1/1991 | Satoh et al. | 369/54 |
| 5,084,789 | 1/1992 | Kamo et al. | 360/53 |
| 5,249,187 | 9/1993 | Bruekert et al. | 371/68.1 |
| 5,249,279 | 9/1993 | Schmenk et al. | 395/425 |
| 5,253,256 | 10/1993 | Oyama et al. | 371/40.1 |

OTHER PUBLICATIONS

"Maintaining IBM Storage Subsystem Media," IBM's Manual GC 26–4495–02, pp. 102–107. (provided in English).
"Storage Subsystem Library—IBM 9340 Direct Access Storage Subsystems Reference," IBM's Manual GC 26–4647–00, pp. 11 and 79–84. (provided in English).

*Primary Examiner*—Hoa T. Nguyen
*Attorney, Agent, or Firm*—Fay, Sharpe, Beall, Fagan, Minnich & McKee

[57] ABSTRACT

A disk controller itself performs the serial inspection process in the following way. It divides a track into a current track group directly available for an external computer and a spare track group available for the disk controller independently of the external computer before registering the groups in it. It also automatically selects a track available in the spare track group as an alternative track. It further copies to the alternative track data recorded on a current track to be inspected. In turn, the disk controller writes a test pattern on the current track. With this, it detects a defect position on a surface of a recording medium of the current track. It also registers the defect position detected on the surface of the recording medium to the current track. It further copies the data having been copied on the alternative track to the current track.

4 Claims, 11 Drawing Sheets

METHOD AND SYSTEM FOR A HIGH-RELIABLE DISK SYSTEM

BACKGROUND OF THE INVENTION

1. Field of the Invention

The present invention relates to a disk controller. More particularly, it concerns a method and system for a high-reliable disk system to increase trouble resistivity and maintainability to partial defects on surfaces of recording media of a multiple of drives connected to a disk system.

2. Description of the Prior Art

Conventionally, as described in the IBM's manual GC 26-495-02, "Maintaining IBM Storage Subsystem Media," maintenance of a surface of a disk recording medium (hereinafter referred to as the inspection process) has been accomplished by way of a system software in a host computer or an external computer (hereinafter briefly referred to as the host) with use of read and write features of a disk controller. That is, the host directs the disk controller to read data on a current track, to assign an alternative track, to write the data of the current track to the alternative track, and to write to and read a test pattern from the current track. With this, the disk controller detects and reads defect position information on the surface of the recording medium, and writes the information onto the current track, and reads and rewrites the data saved on the alternative track to the current track.

In the prior method that the inspection process is made as the host feature, a series of processes for detecting the defect positions on the surface of the disk recording medium have to be executed as jobs of the host computer. This involves the disadvantage that the jobs temporarily occupy the CPU of the host computer which is resources of the host computer or the channel bus. In addition, a user has to manipulate for entering jobs for inspection process to the host computer. This involves the disadvantage of possible human errors that could cause troubles of disturbance to an online processing system of the host computer.

SUMMARY OF THE INVENTION

In view of the foregoing, it is an object of the present invention to provide a method and system for a high-reliable disk system in which the inspection process mentioned above is accomplished as features of the disk controller itself, thereby minimizing the prior disadvantages.

Briefly, the foregoing object is accomplished in accordance with aspects of the present invention by the high-reliable disk system in a disk system having a disk controller and a drive including a recording medium. The disk controller includes a means which divides tracks on the recording medium into a current track group which is directly available to an external computer and a spare track group which is directly available to the disk controller, a means for registering which of the tracks are in the current and spare track groups, a means for automatically selecting an available track in the spare track group as an alternative track, and a means for copying data recorded on a selected one of the current tracks to the alternative track.

That is, the disk controller itself performs the serial inspection process in the following way. It divides tracks, each of which is one of physical areas of the disk recording medium, into a current track group directly available for an external computer and a spare track group available for the disk controller independently of the external computer before registering the groups in it. It also automatically selects a track available in the spare track group as an alternative track during the inspection process. It further copies data recorded on a current track to be inspected as specified to the alternative track. In turn, the disk controller writes a diagnostic data (test pattern) on the current track. With this, it detects a defect position on a surface of a recording medium of the current track. It also registers the defect position detected on the surface of the recording medium to the current track. It further copies the data having been copied on the alternative track to the current track.

With the operation briefly described above, the present invention provides the following advantages.

The disk controller itself can perform the inspection process for the current track to be inspected. For that reason, the inspection process will not occupy the CPU of the host computer which is a resource of the host computer or the channel bus. Beside, it is not needed for the user to enter the jobs for the inspection process into the host computer.

The foregoing and other objects, advantages, manner of operation and novel features of the present invention will be understood from the following detailed description when read in connection with the accompanying drawings.

BRIEF DESCRIPTION OF THE DRAWINGS

The present invention may be more fully described by reference to the accompanying drawings in which.

DETAILED DESCRIPTION OF THE PREFERRED EMBODIMENTS

Figure 1:
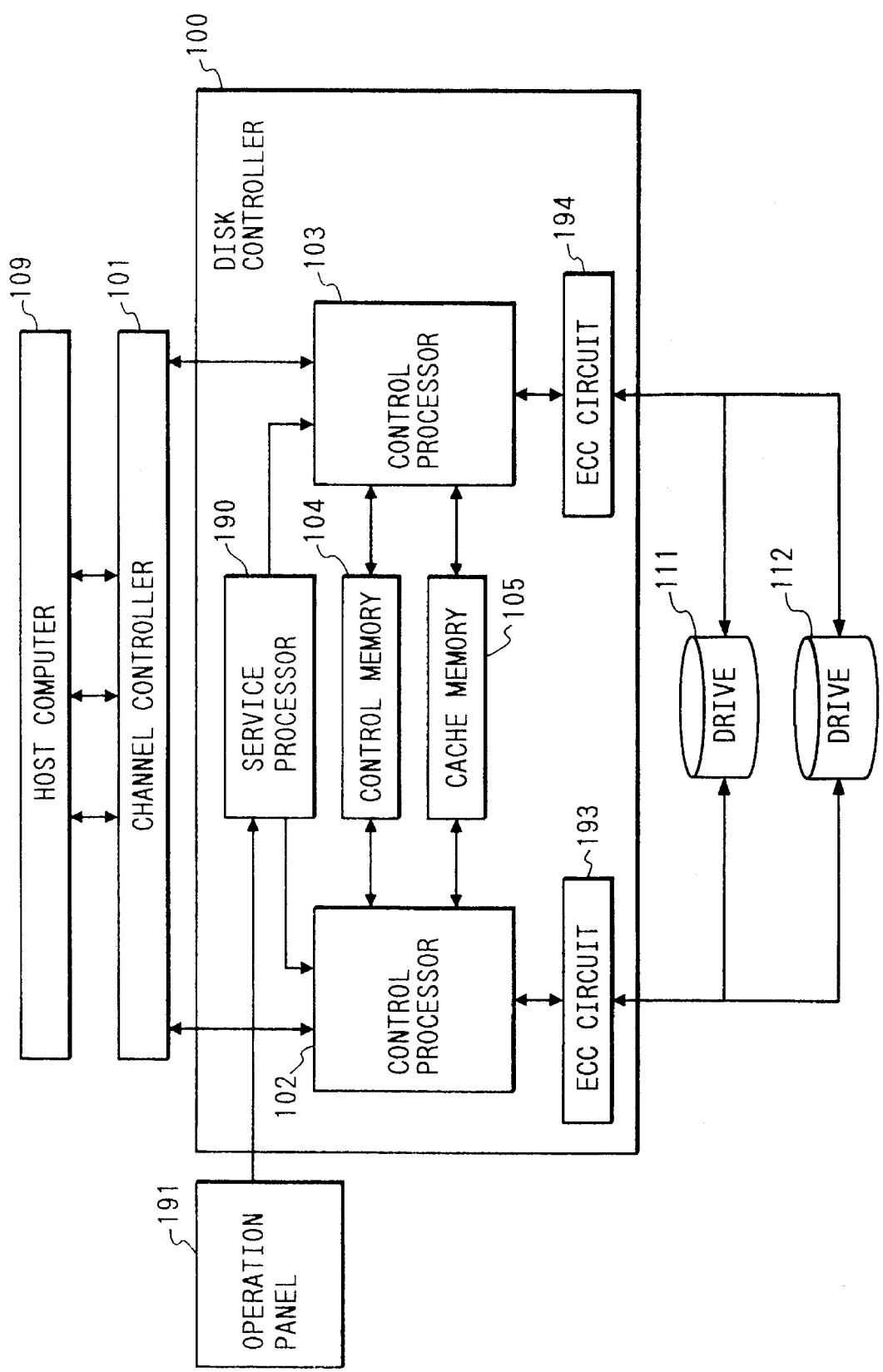
FIG. 1 is a configuration of an embodiment of the present invention which is applied to a disk control subsystem.

FIG. 1 is an embodiment of the present invention which is applied to a disk control subsystem. In the figure, a disk controller 100 is connected between a host computer 109 on an upper level and drives 111 and 112 on a lower level. Disk controller 100 reads from and writes data on the drives as requested by host computer 109. Data transfer between any of the drives and host computer 109 is made by control processors 102 and 103 built in disk controller 100.

A control memory 104 is a common memory to which any of control processors 102 and 103 can access. Control memory 104 has common control information stored therein with which disk controller 100 accesses to the drives. Contents of the common control information will be described later by reference to FIGS. 2 to 5.

A cache memory 105 also is a memory to which any of control processors 102 and 103 can access. Cache memory 105 is used for temporarily storing the data the control processors read out of the drives. Control processors 102 and 103 also are connected with a service processor 190.

If an operation panel 191 directs service processor 190 to update the common control information, service processor 190 selects either of control processor 102 or 103 before sending update request of the common control information to it. The selected control processor then updates the common control information in a control memory 104.

Figure 2:
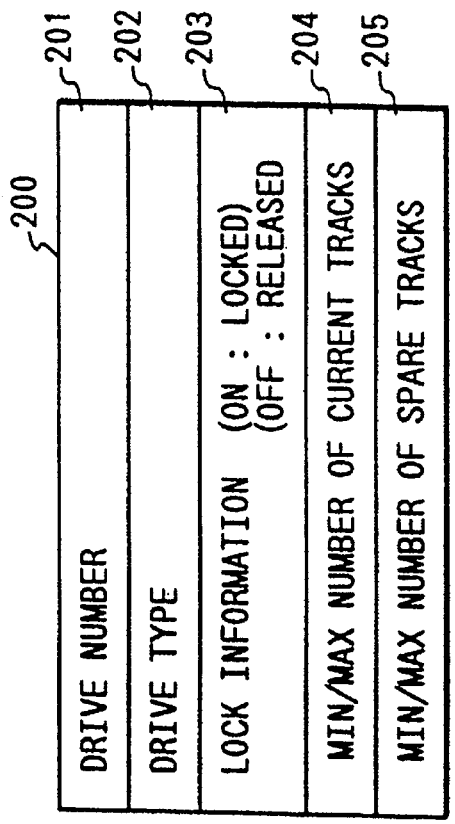
FIG. 2 is construction of a drive control block.

FIG. 2 is a drive control block 200 (abbreviated the DCB) which is one of the common control information. Drive control block 200 is stored in control memory 104. In the DCB are stored a drive number sub-block 201, or drive connection address 201, (abbreviated the DCA), with which disk controller 100 identifies any of the devices, a drive type sub-block 202 indicating a type of the drive, lock information sub-block 203 for exclusive use of the drive, a min/max number block 204 of current tracks with which disk controller 100 stores data as directed by host computer 109, and a min/max number block 205 of spare tracks which disk controller 100 uses in the inspection process for itself.

Figure 3:
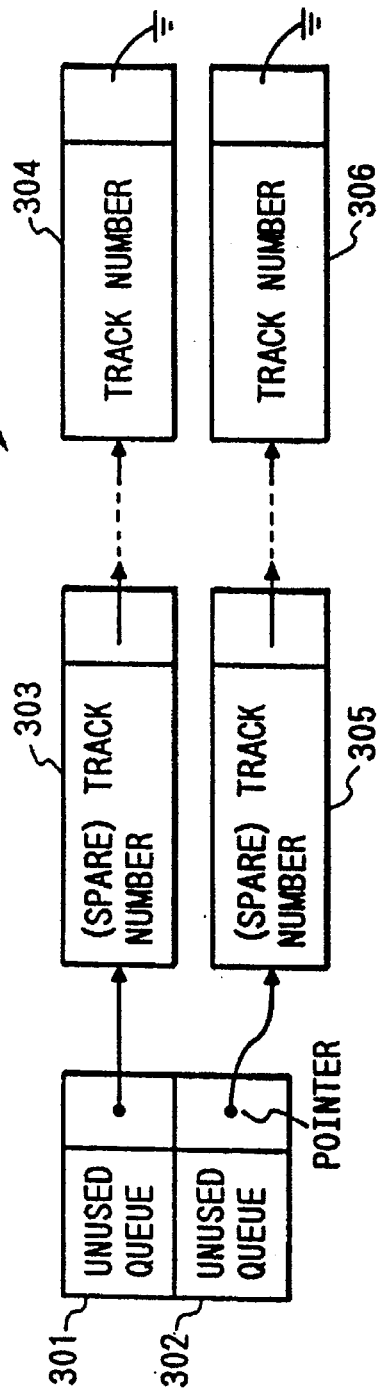
FIG. 3 is construction of a track management information which is one of the common control information.

FIG. 3 is track management information 300 which is one of the common control information. Track management information 300 is stored in control memory 104. In track management information 300, of the track groups each drive has, the track group corresponding to the spare tracks mentioned above is classified to two kinds: one is of unused spare tracks and the other is of spare tracks which have been used for backing up the current tracks; in track management information 300, also, an area of the control memory having the track numbers of the spare tracks stored therein is managed as queue structure list (301 and 302). That is, in track management information 300, any of the track numbers on the table has a pointer given thereto, which indicates the next track number.

Figure 4:
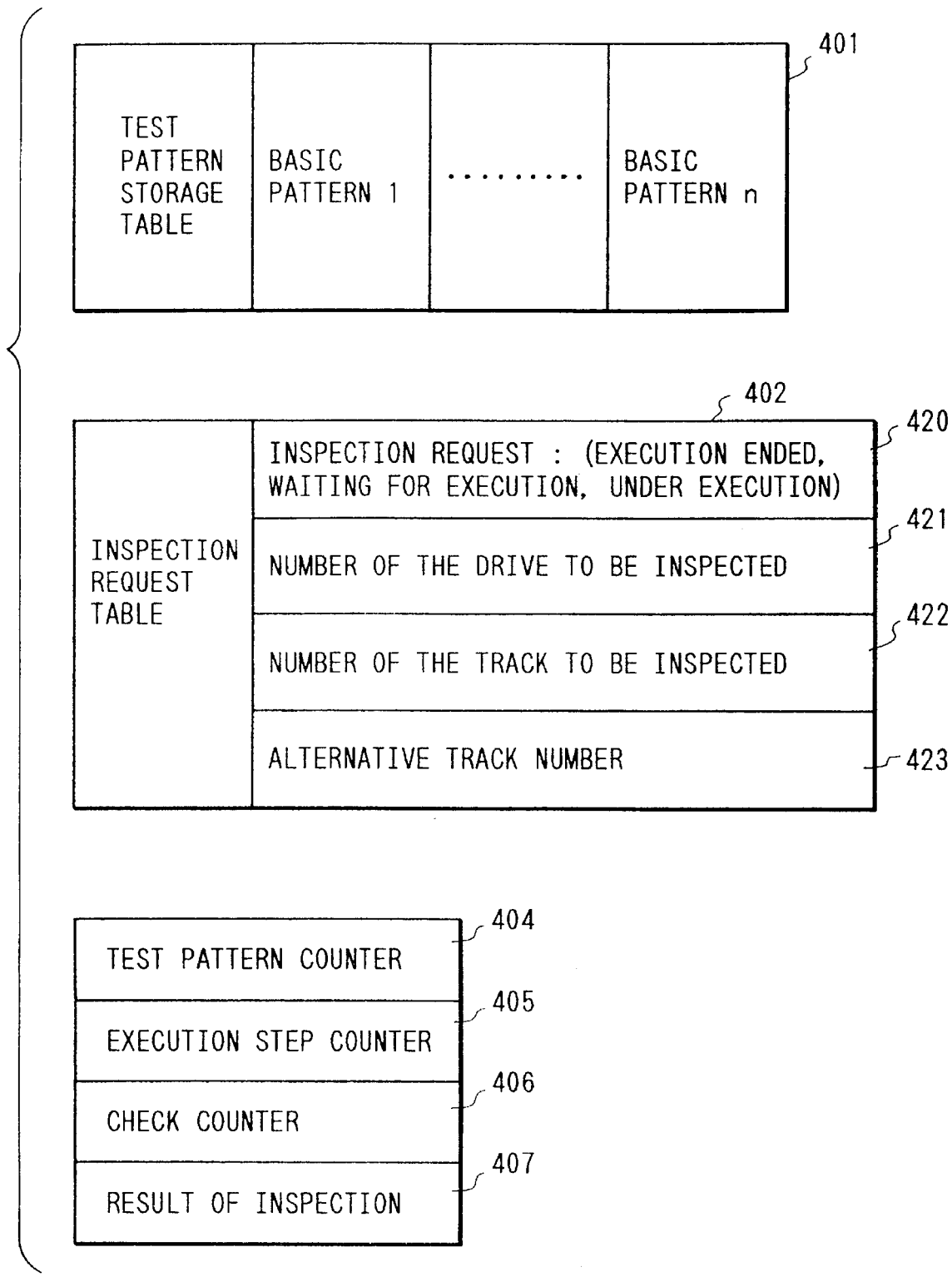
FIG. 4 is construction of an inspection control information which is one of the common control information.

FIG. 4 is inspection control information which is one of the common control information. The inspection control information is stored in control memory 104. In a test pattern storage table 401, a plurality (e.g. n kinds) of basic patterns (bit strings with 0 or 1 for each bit) for generation of diagnostic data (test patterns) which will be detailed later, are stored.

In order to set the inspecting request to the disk controller, an inspection request 420 in an inspection request table 402 is set in a 'waiting for execution' state; also, a drive number 421 of drive to be inspected and its track number 422 of track to be inspected are set. Inspection request table 402 sets them from operation panel 191 through service processor 190 if inspection request 420 is in an 'execution ended' state.

There can be provided a plurality of inspection request tables 402 up to number of the drives. This needs a plurality of the control processors for parallel process. It also needs the same numbers of the counters and tables concerned as that of the inspection request tables.

A test pattern counter 404 is a counter for storing how many kinds of test patterns the inspection process has written and read as to each of the tracks to be inspected, provided that there are n kinds of test patterns.

An execution step counter 405 is a counter for indicating to what one of execution steps the inspection process has proceeded in its contents as to each of the test patterns. The contents will be described later.

A check counter 406 is a counter for storing number of times the inspection process has checked reading of any of the test patterns for the track to be inspected. The inspection process should be made m times for one test pattern to protect to possible errors of a reading side.

A result of inspection 407 is a table for storing results of execution through the inspection process which will be described in detail later.

Figure 5:
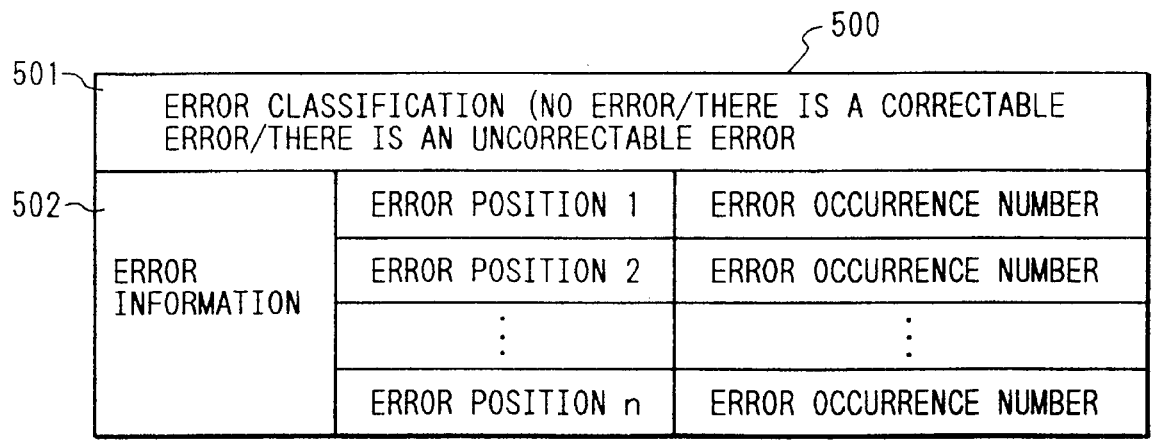
FIG. 5 is construction of a read error occurrence statistic information which is one of the common control information.

FIG. 5 is a read error occurrence statistic information 500 which is one of the common control information. Read error occurrence statistic information 500 is stored in control memory 104. The information is divided into two sections. One is an error classification 501 for storing whether a fault generated during reading of data is correctable or not, or whether there is no error, as to the track to be inspected, which will be described in detail later. The other is an error information 502 for storing where and how many times the correctable errors happened on a plurality of positions on the surface of the track recording medium.

The following describes the contents of the inspection process in the control processors 102 and 103 in the disk controller 100 of the present invention.

Figure 6:
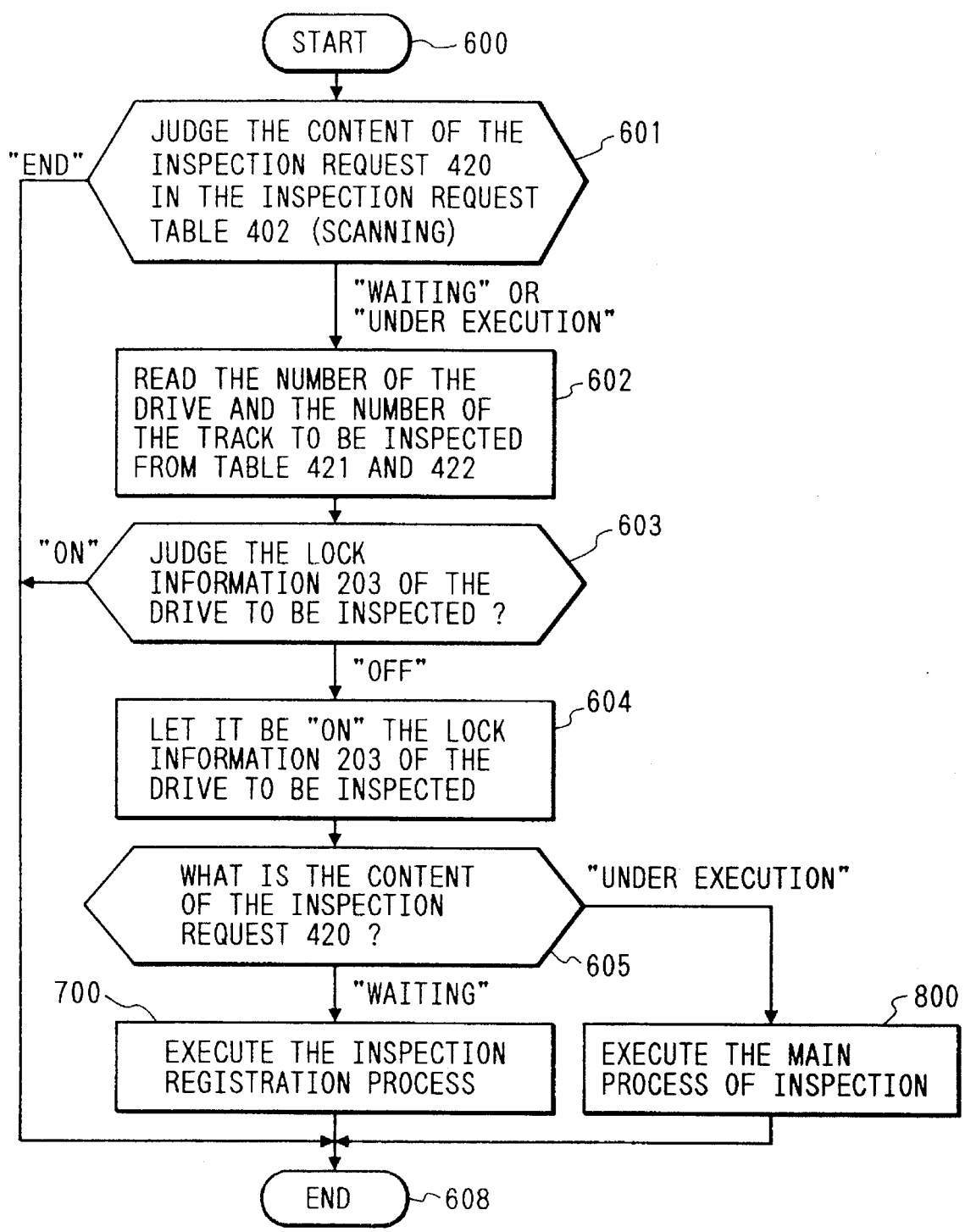
FIG. 6 is a flow chart illustrating the contents of the inspection execution.

FIG. 6 is a flow chart illustrating the contents of the inspection execution. The inspection process is executed at certain intervals by any of the control processors.

First, step 601 reads contents of inspection request 420 in inspection request table 402 before checking them. This is called the scanning step. If the result is that inspection request 420 in inspection request table 402 has 'ended,' the control processor ends its process.

In step 602, the processor having detected that the inspection request 420 was 'waiting' for execution or 'under execution' reads from inspection request table 402 drive number 421 of drive to be inspected and track number 422 of track to be inspected. In step 603, in turn, the processor judges lock information sub-block 203 of the drive to be inspected. If lock information sub-block 203 is already 'on,' the processor ends its process (step 608). If it is 'off,' the processor turns it on to acquire locking of the drive (step 604). If inspection request 420 is 'waiting' for execution, the processor executes an inspection request registration process 700. If inspection request 420 is 'under execution,' the processor executes an inspection main process 800. The following describes steps 700 and 800 mentioned above in detail.

Figure 7:
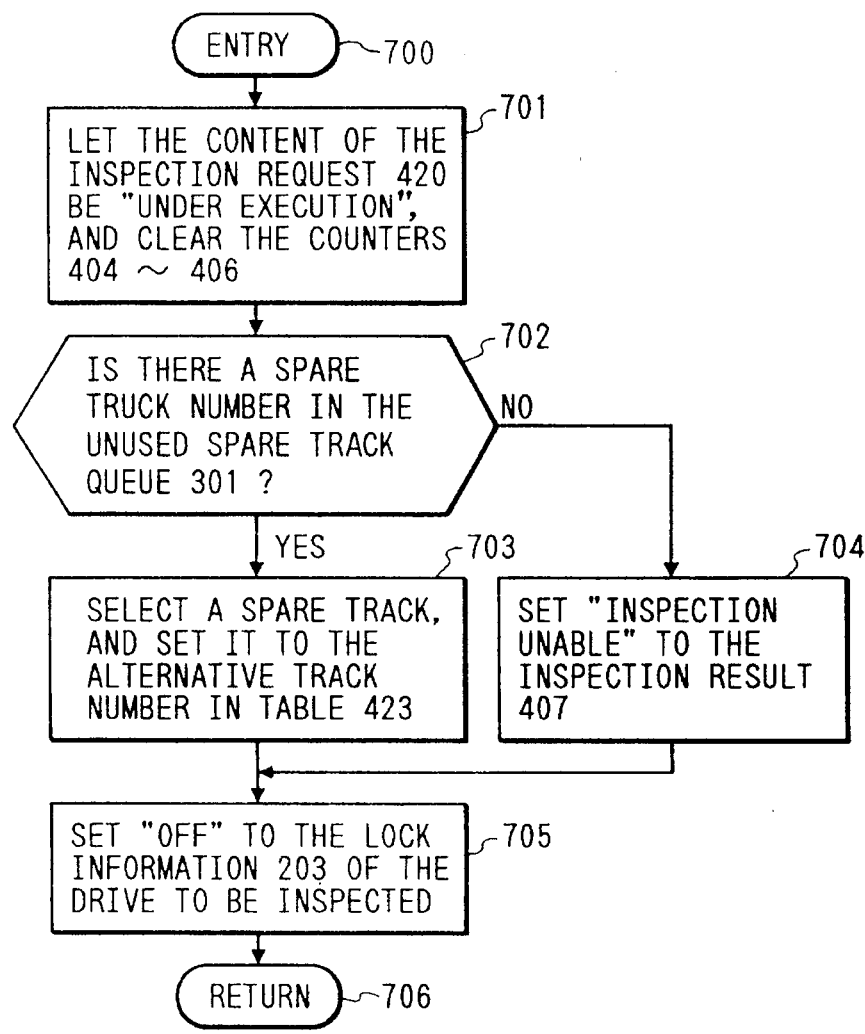
FIG. 7 is a flow chart illustrating contents of an inspection request registration process.

FIG. 7 is a flow chart illustrating contents of inspection request registration process 700. First, step 701 turns the inspection request to 'under execution' before clearing counters 404 to 406 to zero. Step 703 selects from unused spare track queue 301 (FIG. 3) one spare track called the alternative track for use as a save track for data of the current track before setting its track number on alternative track number 423 in inspection request table 402. Step 705 turn 'off' the lock information of the acquired drive to release. If there is no unused spare track, step 704 sets 'inspection unable' to inspection results 407; step 705 releases locking of the acquired drive; and, step 706 returns control to inspection execution process 608.

Figure 8:
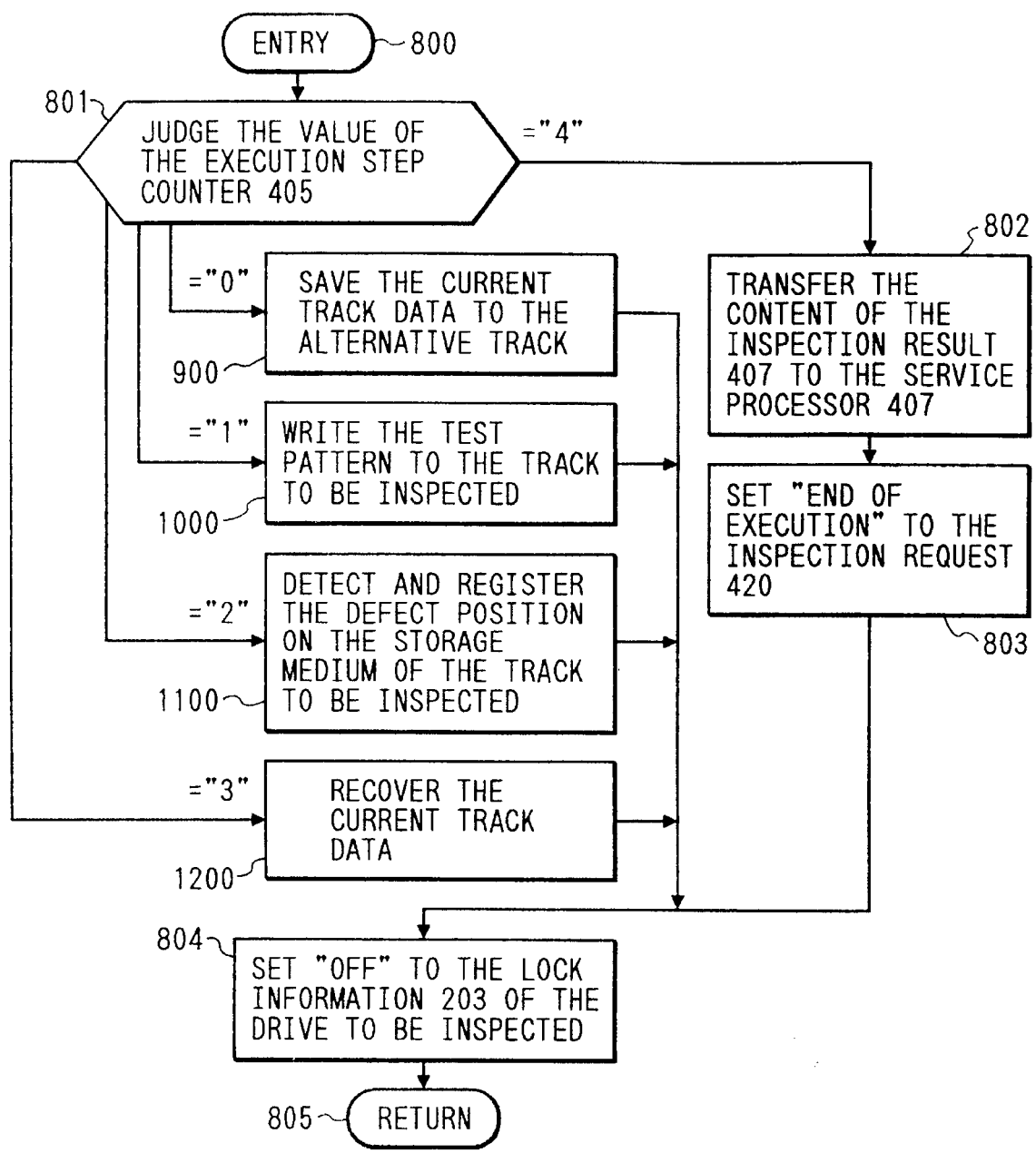
FIG. 8 is a flow chart illustrating an inspection main process.

FIG. 8 is a flow chart illustrating an inspection main process 800. First, step 801 looks up a value of execution step counter 405. If the value is already a threshold value of 4, step 802 transfers contents of inspection results 407 to service processor 190. Step 803 'ends' inspection request 420 in inspection request table 402. Step 804 releases locking of the acquired drive. Step 805 returns control to inspection execution process 608.

In the other cases, look-up is made in execution step counter 405. Depending on the result of look-up, selection is made either of a current track data save process 900, a test pattern write process 1000, a recording medium defect position detection and registration process 1100, or a current track data recovery process 1200. The following describes these steps in detail.

Figure 9:
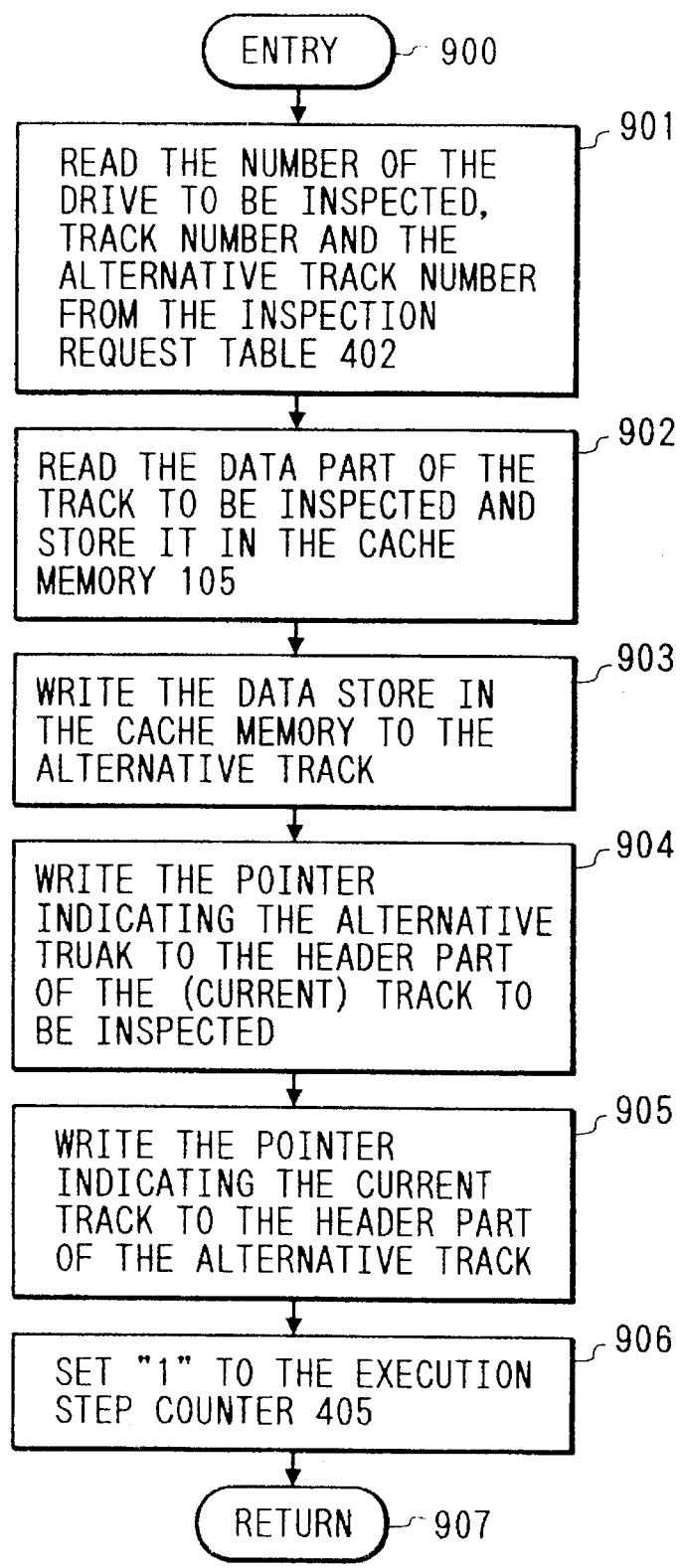
FIG. 9 is a flow chart illustrating contents of current track data save process.

FIG. 9 is a flow chart illustrating contents of current track data save process 900.

Current track data save process 900 is executed if a value of execution step counter 405 is '0.' First, step 901 reads from the inspection request table 402, a drive number in a column 421 in said table 402 of drive to be inspected and a track number in a column 422 of track to be inspected and its alternative track number in a column 423 in said table 402.

Step 902 reads a data part 132 (FIG. 13) of a current track 130 (FIG. 13) having current track number in said column 422 of track to be inspected to send to cache memory 105. Step 903 writes the read data to a data part 134 (FIG. 13) of an alternative track 135 (FIG. 13) having alternative track number in said column 423.

Then, Step 904 writes an alternative track pointer 136 indicating the alternative track into a header part 131 (FIG. 13) of the current track. Step 905 writes a current track pointer 137 indicating the current track into a header part 133 (FIG. 13) of the alternative track.

Finally, step 906 turns the value of execution step counter 405 to '1.' Step 907 returns control to inspection main process 804. It should be noted that access request of host computer 109 to the current track to be inspected is executed for the alternative track indicated by alternative track pointer 136.

Figure 10:
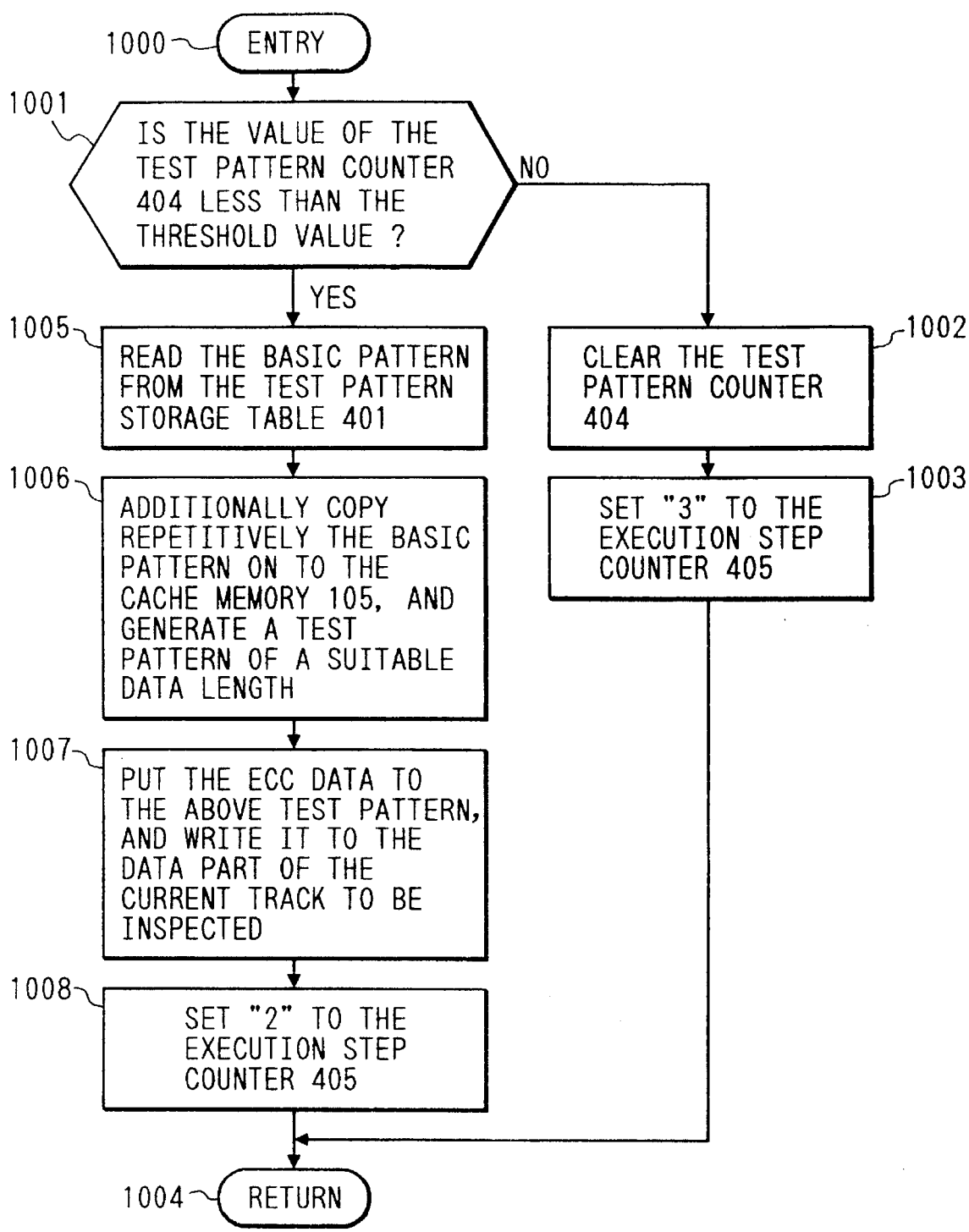
FIG. 10 is a flow chart illustrating contents of test pattern write process.

FIG. 10 is a flow chart illustrating contents of test pattern write process 1000.

Test pattern write process 1000 is executed if the value of execution step counter 405 is '1.' First, step 1001 judges whether or not test pattern counter 04 already reaches a threshold value of n. If so, step 1002 clears test pattern counter 404 to zero.

Then, step 1003 sets the value of execution step counter 405 to '3.' Step 1004 returns control to inspection main process 804.

If test pattern counter 404 has not reached the threshold value yet, step 1005 reads from test pattern storage table 401 a basic pattern corresponding to the value of test pattern counter 404. Step 1006 copies it onto cache memory 105 repeatedly and additionally until it generates a test pattern having a data length needed to write on the whole track.

Figure 13:
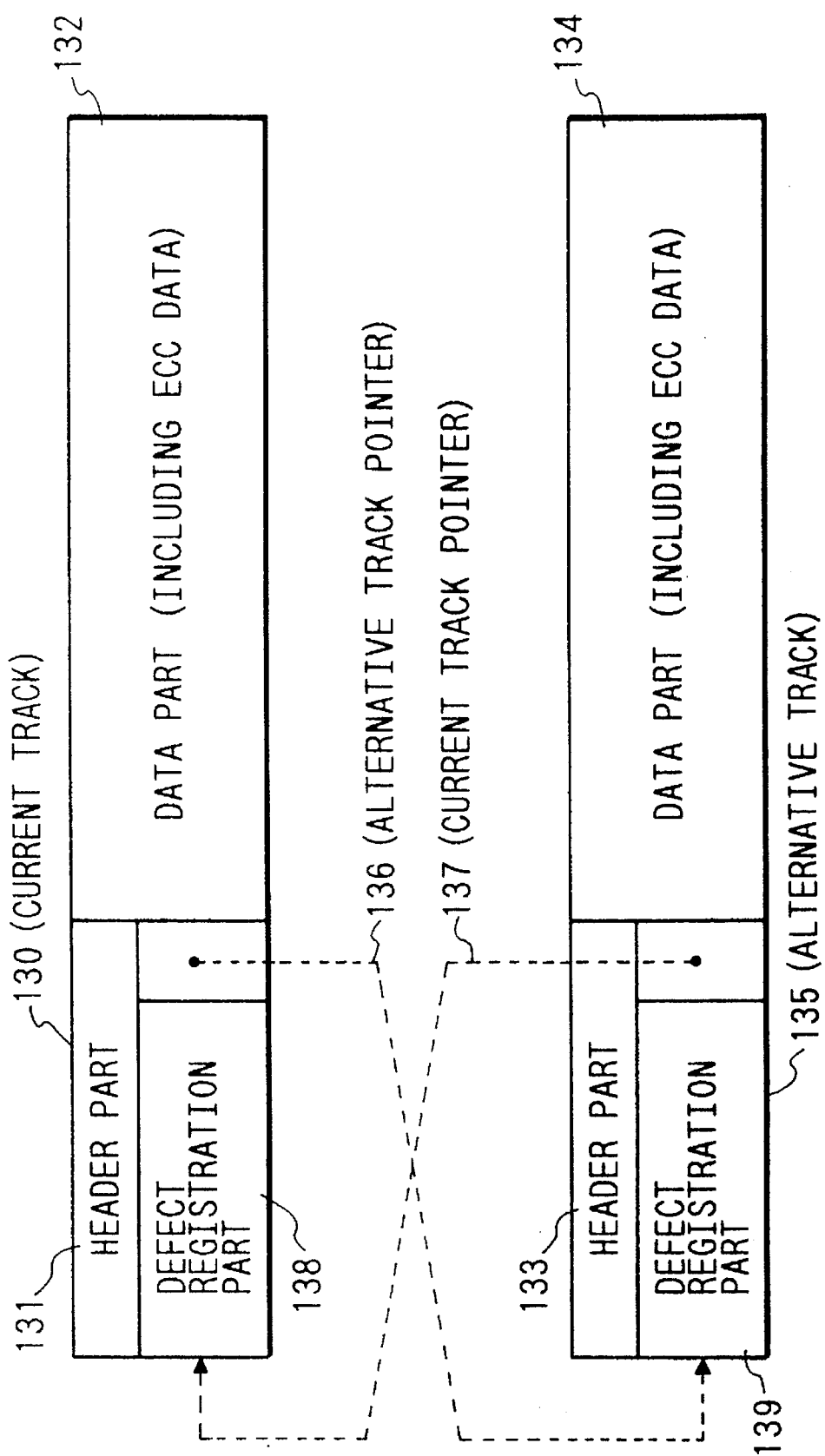
FIG. 13 is a track format in an embodiment of the present invention.

Step 1007 makes the test pattern pass through ECC (Error Correcting Code) circuits 193 and 194 in FIG. 1 to make the test pattern added with ECC data before it is written in data part 132 of the current track (FIG. 13). Then, step 1008 sets the value of execution step counter 405 to '2.' Step 1004 returns control to inspection main process 804.

In checking of reading the test pattern, it is made to halt reading the test pattern at a position on the track at which error is detected, and to record the error generation position and number of times of error occurrence. Checking reading of the test pattern is made again. If error is detected, reading is halted, and recording is made in the same way as above. If the error happens over a predetermined number of times at the same position, the position is regarded as defect position as described later.

For example, if reading check of test pattern 1 is made m times after it was written, reading check is moved to test pattern 2. Assume it be inspected only once that reading check is made m times of test patterns 1 to n. It may occur that reading check of, for example, test pattern 1 cannot be made for the other positions after a point at which error happened. For the reason as shown, check counter 406 should be reset to '−1' at the time when error is detected. This allows reading check to be always made m times for test patterns 1 to n even of the positions after the point at which error happened.

Figure 11:
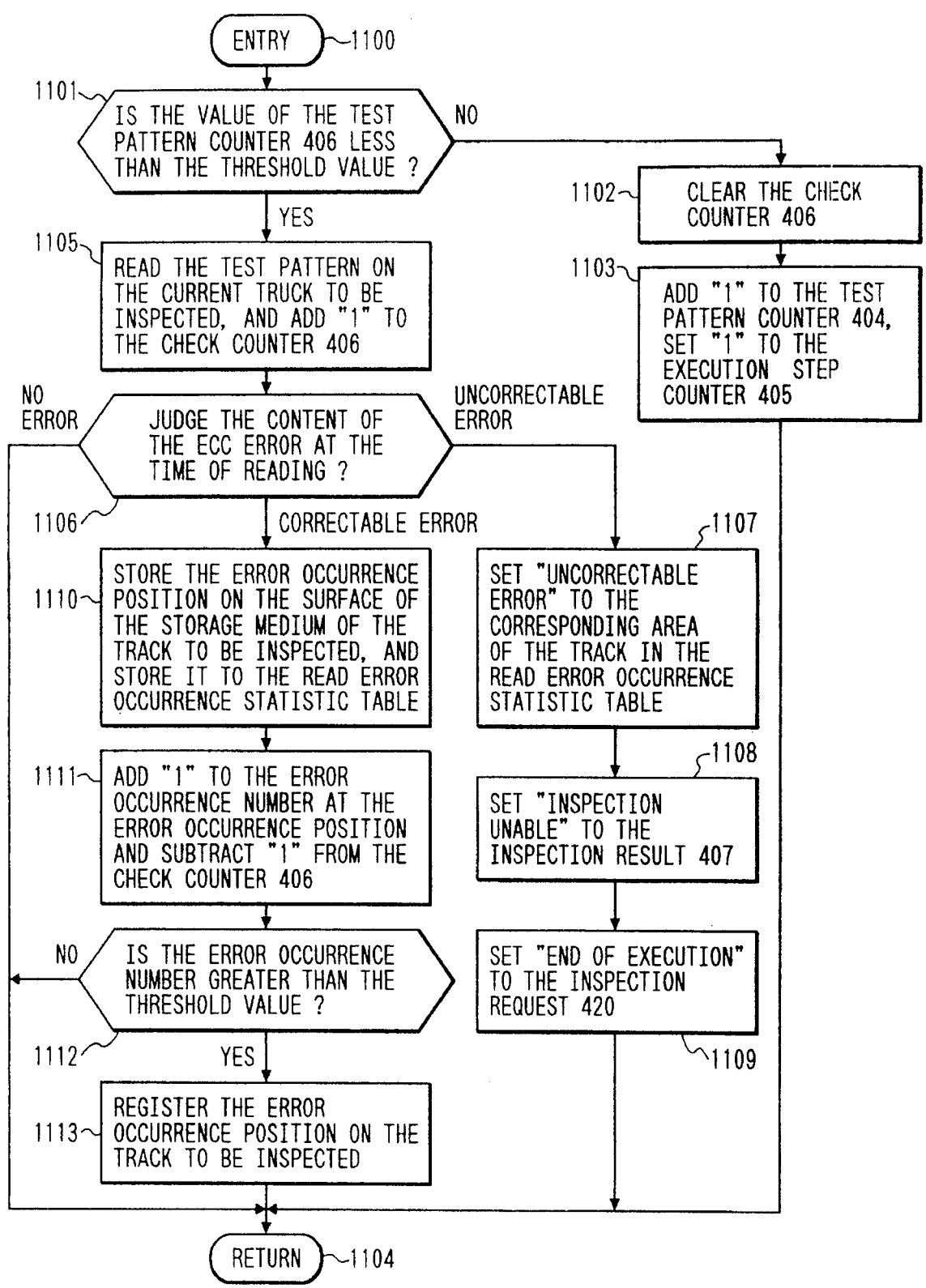
FIG. 11 is a flow chart illustrating contents of recording medium defect position detection and registration process.

FIG. 11 is a flow chart illustrating contents of recording medium defect position detection and registration process 1100.

Recording medium defect position detection and registration process 1100 is executed if the value of execution step counter 405 is '2.' First, step 1101 judges whether or not the value of check counter 406 reaches a threshold value of m. If so, step 1102 clears check counter 406 to zero. Step 1103 then adds '1' to test pattern counter 404, and sets '1' to execution step counter 405. Step 1104 returns control to inspection main process 804.

If the value of check counter 406 has not reached the threshold value of m, step 1105 reads the test pattern written on the current track to be inspected through ECC circuits 193 and 194 (FIG. 1) to make the test pattern, and adds '1' to check counter 406. Step 1106 judges whether or not ECC error happens at the time of reading. Depending on the result, recording medium defect position detection and registration process 1100 proceeds as follows.

Case 1: If the ECC circuit detects an uncorrectable error happened, step 1107 records the uncorrectable error in the corresponding area of the track in read error occurrence statistic information 500. Step 1108 sets 'inspection unable' to inspection results 407. Step 1109 sets 'end of execution' to inspection request 420 of inspection request table 402. Step 1104 returns control to inspection main process 804.

Case 2: If the ECC circuit detects a correctable error happened, step 1110 reads an occurrence position of the correctable error on the surface of the storage medium of the track to be inspected, and stores it in the corresponding area of the track in read error occurrence statistic information 500. Step 1111 adds '1' to the number of error occurrences at the error occurrence position, and subtracts '1' from check counter 406. If the number of error occurrences exceeds beyond a threshold value, step 1113 registers the error occurrence position in defect registration part 138 of header part 131 of the current track as defect medium position. Step 1104 returns control to inspection main process 804. The following writing and reading checks of the current track are made for the surface of the recording medium except the registered defect position.

Case 3: If there are no errors, step 1104 returns control to inspection main process 804.

Figure 12:
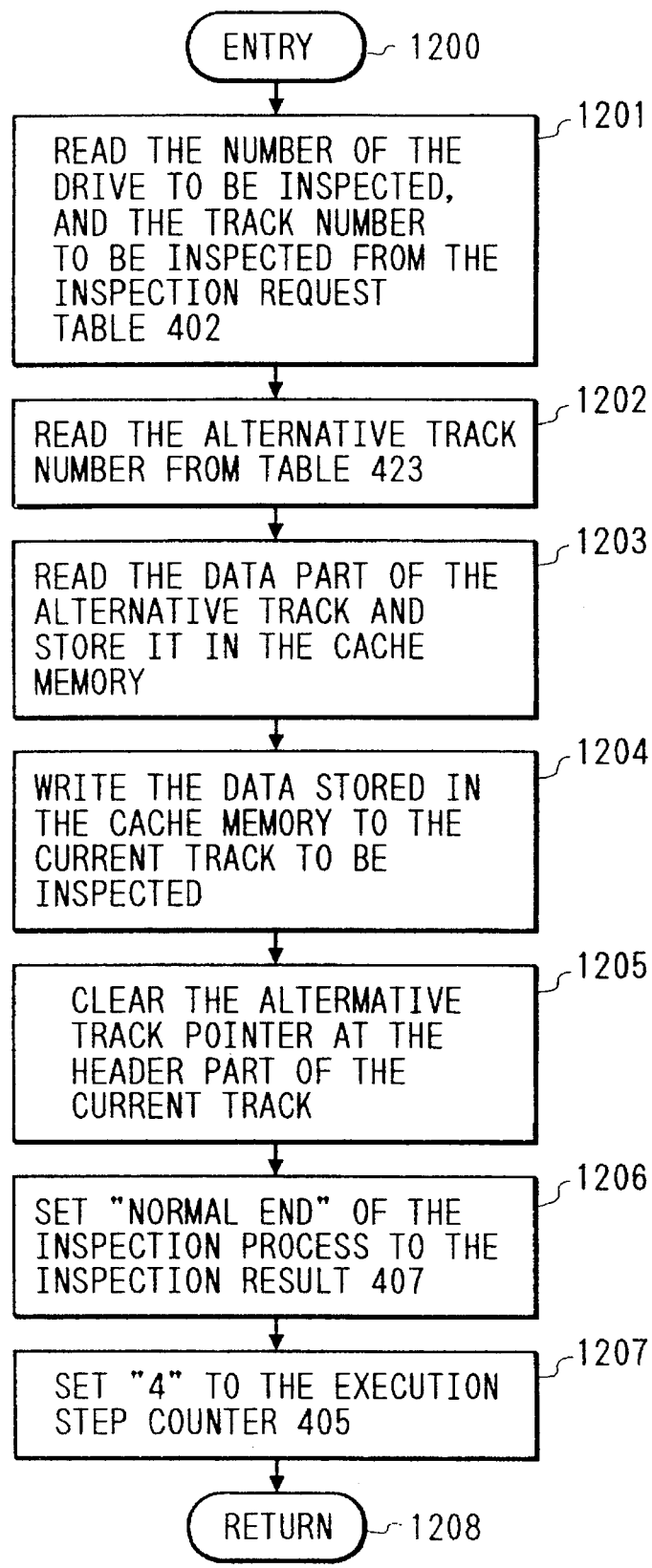
FIG. 12 is a flow chart illustrating contents of current track data recovery process.

FIG. 12 is a flow chart illustrating contents of current track data recovery process 1200.

Current track data recovery process 1200 is executed if a value of execution step counter 405 is '3.' First, step 1202 checks inspection request table 402 before reading drive number 421 of drive to be inspected and track number 422 of track to be inspected and its alternative track number 423.

Step 1203 reads data part 134 (FIG. 13) of the track having the alternative track number to send to cache memory 105. Step 1204 writes the read data to data part 132 (FIG. 13) of the track having the current track number.

Then, Step 1205 clears to zero pointer 136 indicating the alternative track for header part 131 (FIG. 13) of the current track.

Step 1206 sets 'normal end of inspection process' to inspection results 407. Step 1207 turns the value of execution step counter 405 to '4.' Step 1208 returns control to inspection main process 804. It should be noted that access request of host computer 109 to the current track to be inspected is executed for the alternative track indicated by alternative track pointer 136.

FIG. 13 is a track format already referred to above. In the figure are shown current track 130 and alternative track 135. Each of the tracks has header parts 131 and 133 and data parts 132 and 134. Header part 131 has a defect registration part 138 and alternative track pointer 136. header part 133 has a defect registration part 139 and current track pointer 137.

With the processes described above, the disk controller can accomplish by itself rewriting on the current track the data on the current track having partial defects on the recording medium. It can make this by keeping away from the defect positions. This increases tolerance of the disk subsystem against the partial defects of the recording medium.

The drive to be inspected can be locked to allow the host computer 109 write in or read data from the drive even during the serial inspection process while none of the above-described steps of the inspection process has locked the drive yet, since the drive is locked or released every time any of the steps of the inspection process is started or ended. It is possible to perform in parallel the inspection process and data writing to or reading from the host computer 109.

The embodiment described so far has cache memory 105 used to generate the test pattern data or to copy data between the tracks. The cache can be replaced by an internal memory of the control process.

In the embodiment, also, the drive number of the driver to be inspected and the track number of the track to be inspected are written in the inspection request table of the control memory through the operation panel for the service processor built in the disk controller. The service processor can have a serial communication interface, such as RS232-C, to allow sending the drive number of the drive to be inspected and the track number of the track to be inspected from a remote maintenance station to the service processor of the disk controller through a telephone line or the like, thereby writing it into the inspection request table of the control memory.

The control memory is made to store number of times of the correctable error which happen while the control processor in the disk controller is reading user data of any of the drives. For the track of which the number of times of the correctable error exceeds beyond a threshold value, the inspection process request of the track can be automatically written in the inspection request table of the control memory.

With the construction of the high-reliable disk system of the present invention described so far, the present invention provides the following effects.

The high-reliable disk system can preventively keep away from the partial defects on the surface of the recording medium of the current drive without occupying the CPU or channel bus which is a resource of the host computer for the inspection process. This is due to the fact that the disk controller can perform the inspection process for the current track to be inspected by itself. In addition, the high-reliable disk system can avoid any of the troubles due to possible disturbance caused to an online processing system of the host computer by human error during entering a job or similar works, since no manipulations are needed for a user to enter the job to the host computer for the inspection process.

What is claimed is:

1. A defect recovery method comprising:

providing a disk system having a disk controller for controlling and maintaining tracks on a recording medium and copying data among the tracks, the disk controller including an internal storing means, a track dividing means, a track selecting means, a defect identifying means, a defect counting means, a comparing means, a data writing means, a data reading means and a drive;

with said disk controller track divider means, dividing tracks on said recording medium into: (i) a current track group directly available to an external computer and (ii) a spare track group available to said disk controller;

storing an identification of the tracks in the current track group and the spare track group in the disk controller internal storing means;

with said disk controller track selecting means, automatically selecting a track in said spare track group as an alternative track;

selecting a current track from the current track group with the disk controller track selecting means;

if said selected current track has data recorded thereon, identifying defects in data recorded on the selected current track with the disk controller defect identifying means;

with said disk controller defect counting means, counting a number of identified defects on the selected current track;

comparing the counted number with a threshold value with said disk controller comparing means;

in response to the counted number being greater than the threshold value, with said disk controller data writing means, copying the data recorded on said selected current track to said alternative track;

after copying the recorded data from the selected current track to the alternative track, with said disk controller data writing means writing prepared diagnostic data onto said selected current track;

with said disk controller data reading means, reading the preprepared diagnostic data written on said selected current track;

with the defect identifying means identifying any defect positions on said selected current track;

storing each identified defect position in the internal storage means; and with said disk controller data writing means, copying the data from said alternative track back to said selected current track, without recording in the identified defect positions.

2. A defect recovery system comprising:

a disk system having a disk controller for controlling and maintaining tracks on a recording medium and copying data among the tracks, the disk controller including:

a track divider means for dividing tracks on said recording medium into: (i) a current track group directly available to an external computer and (ii) a spare track group available to said disk controller;

a track selecting means for automatically selecting one of (i) a track in said spare track group as an alternative track and (ii) a current track from the current track group;

a defect identifying means for identifying any defects in data recorded on the selected current track and a position of each identified defect on the selected current track;

an internal storage means for storing (i) an identification of the tracks in the current track group and the spare track group and (ii) storing each identified defect position;

a defect counting means for counting a number of identified defects on the selected current track;

a comparing means for comparing the counted number of identified defects with a threshold value;

a data writing means for (i) copying the data recorded on said selected current track to said alternative track in response to the counted number of identified defects being greater than the threshold value, (ii) writing prepared diagnostic data onto said selected current track, after copying the data from the selected current track to the alternative track, and (iii) copying the data from said alternative track back to said selected current track, without recording in the identified defect positions; and, a data reading means for reading the preprepared diagnostic data written on said selected current track.

3. A defect recovery system according to claim 2 further comprising:

an operation panel connected to said disk controller, said operation panel including means for designating each selected current track to be inspected.

4. A defect recovery system according to claim 2, wherein said disk controller is connected with a remote station through a communication line, said system further comprising:

means for remotely directing a track number of said selected current track from said remote station through said communication line to said disk controller.

* * * * *